(12) United States Patent
Ricci et al.

(10) Patent No.: US 8,038,796 B2
(45) Date of Patent: Oct. 18, 2011

(54) APPARATUS FOR SPATIAL AND TEMPORAL CONTROL OF TEMPERATURE ON A SUBSTRATE

(75) Inventors: Anthony J. Ricci, Sunnyvale, CA (US); Keith Comendant, Fremont, CA (US); James Tappan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 492 days.

(21) Appl. No.: 11/027,481

(22) Filed: Dec. 30, 2004

(65) Prior Publication Data
US 2006/0144516 A1   Jul. 6, 2006

(51) Int. Cl.
*H01L 21/67* (2006.01)
*H01L 21/02* (2006.01)
*C23C 14/50* (2006.01)

(52) U.S. Cl. ............... 118/724; 118/725; 156/345.27; 156/345.52; 156/345.53; 361/234; 279/128

(58) Field of Classification Search .......... 156/345.27, 156/345.52, 345.53; 118/725, 724; 361/234; 279/128
See application file for complete search history.

(56) References Cited

U.S. PATENT DOCUMENTS

| | | | |
|---|---|---|---|
| 4,455,462 A * | 6/1984 | DeLucia | 200/61.62 |
| 4,518,848 A | 5/1985 | Weber | |
| 5,059,770 A | 10/1991 | Mahawila | |
| 5,250,137 A | 10/1993 | Arami | |
| 5,280,156 A | 1/1994 | Niori et al. | |
| 5,294,778 A | 3/1994 | Carmen et al. | |
| 5,413,360 A | 5/1995 | Atari et al. | |
| 5,539,179 A | 7/1996 | Nozawa et al. | |
| 5,609,720 A | 3/1997 | Lenz et al. | |
| 5,625,526 A | 4/1997 | Watanabe | |
| 5,685,363 A * | 11/1997 | Orihira et al. | 165/46 |
| 5,761,023 A | 6/1998 | Lue et al. | |

(Continued)

FOREIGN PATENT DOCUMENTS

JP   11-243077   9/1999
(Continued)

OTHER PUBLICATIONS

Invitation to Pay Additional Fees, PCT/US2005/047109, Dated Jul. 11, 2006 5 pps.

(Continued)

*Primary Examiner* — Sylvia R. MacArthur
(74) *Attorney, Agent, or Firm* — Buchanan Ingersoll & Rooney PC

(57) ABSTRACT

An apparatus for control of a temperature of a substrate has a temperature-controlled base, a heater, a metal plate, a layer of dielectric material. The heater is thermally coupled to an underside of the metal plate while being electrically insulated from the metal plate. A first layer of adhesive material bonds the metal plate and the heater to the top surface of the temperature controlled base. This adhesive layer is mechanically flexible, and possesses physical properties designed to balance the thermal energy of the heaters and an external process to provide a desired temperature pattern on the surface of the apparatus. A second layer of adhesive material bonds the layer of dielectric material to a top surface of the metal plate. This second adhesive layer possesses physical properties designed to transfer the desired temperature pattern to the surface of the apparatus. The layer of dielectric material forms an electrostatic clamping mechanism and supports the substrate.

19 Claims, 14 Drawing Sheets

U.S. PATENT DOCUMENTS

| | | | |
|---|---|---|---|
| 5,851,641 | A | 12/1998 | Matsunaga et al. |
| 5,854,468 | A | 12/1998 | Muka |
| 5,925,227 | A | 7/1999 | Kobayashi et al. |
| 5,968,273 | A | 10/1999 | Kadomura et al. |
| 5,978,202 | A * | 11/1999 | Wadensweiler et al. ...... 361/234 |
| 6,031,211 | A | 2/2000 | Mailho et al. |
| 6,051,303 | A | 4/2000 | Katsuda et al. |
| 6,072,685 | A | 6/2000 | Herchen |
| 6,080,969 | A | 6/2000 | Goto et al. |
| 6,080,970 | A | 6/2000 | Yoshida et al. |
| 6,084,215 | A | 7/2000 | Furuya et al. |
| 6,100,506 | A | 8/2000 | Colelli, Jr. et al. |
| 6,140,612 | A | 10/2000 | Husain et al. |
| 6,151,203 | A | 11/2000 | Shamouilian |
| 6,215,641 | B1 * | 4/2001 | Busse et al. .................. 361/234 |
| 6,259,592 | B1 | 7/2001 | Ono |
| 6,310,755 | B1 | 10/2001 | Kholodenko et al. |
| 6,365,879 | B1 | 4/2002 | Kuibira et al. |
| 6,379,222 | B2 | 4/2002 | Wise et al. |
| 6,452,775 | B1 | 9/2002 | Nakajima |
| 6,482,747 | B1 | 11/2002 | Takahashi et al. |
| 6,508,884 | B2 | 1/2003 | Kuibira et al. |
| 6,770,852 | B1 | 8/2004 | Steger |
| 6,847,014 | B1 | 1/2005 | Benjamin et al. |
| 7,161,121 | B1 | 1/2007 | Steger |
| 7,274,004 | B2 | 9/2007 | Benjamin et al. |
| 7,337,745 | B1 * | 3/2008 | Komino et al. ........... 118/723 E |
| 7,965,283 | B2 | 6/2011 | Umezaki |
| 2003/0168439 | A1 | 9/2003 | Kanno et al. |
| 2003/0198005 | A1 | 10/2003 | Sago et al. |
| 2005/0173404 | A1 | 8/2005 | Benjamin et al. |
| 2005/0211385 | A1 * | 9/2005 | Benjamin et al. ........ 156/345.52 |
| 2006/0144516 | A1 | 7/2006 | Ricci et al. |
| 2007/0086144 | A1 | 4/2007 | Steger |

FOREIGN PATENT DOCUMENTS

| | | |
|---|---|---|
| JP | 2000-332089 | 11/2000 |
| JP | 2001-102436 A | 4/2001 |
| JP | 2002-76103 | 3/2002 |
| JP | 2002-252271 | 9/2002 |
| JP | 2002-313901 A | 10/2002 |
| JP | 2002359281 A | 12/2002 |
| JP | 2003-060016 A | 2/2003 |

OTHER PUBLICATIONS

International Search Report, PCT/US2005/047109, dated Oct. 18, 2006 17 pps.

Notice of Preliminary Rejection issued Jan. 28, 2011 for Korean Appln. No. 2010-7005037.

Official Action dated Dec. 27, 2010 for Japanese Patent Appln. No. 2007-549558.

Official Action dated May 2, 2010 for Chinese Appln. No. 200580045528.X.

International Search Report and Written Opinion mailed Oct. 18, 2006 for PCT/US2005/047109.

Official Action dated Jul. 27, 2010 for Japanese Patent Appln. No. 2007-544574.

Official Action dated Jun. 13, 2011 for Japanese Patent Appln. No. 2007-549558.

* cited by examiner

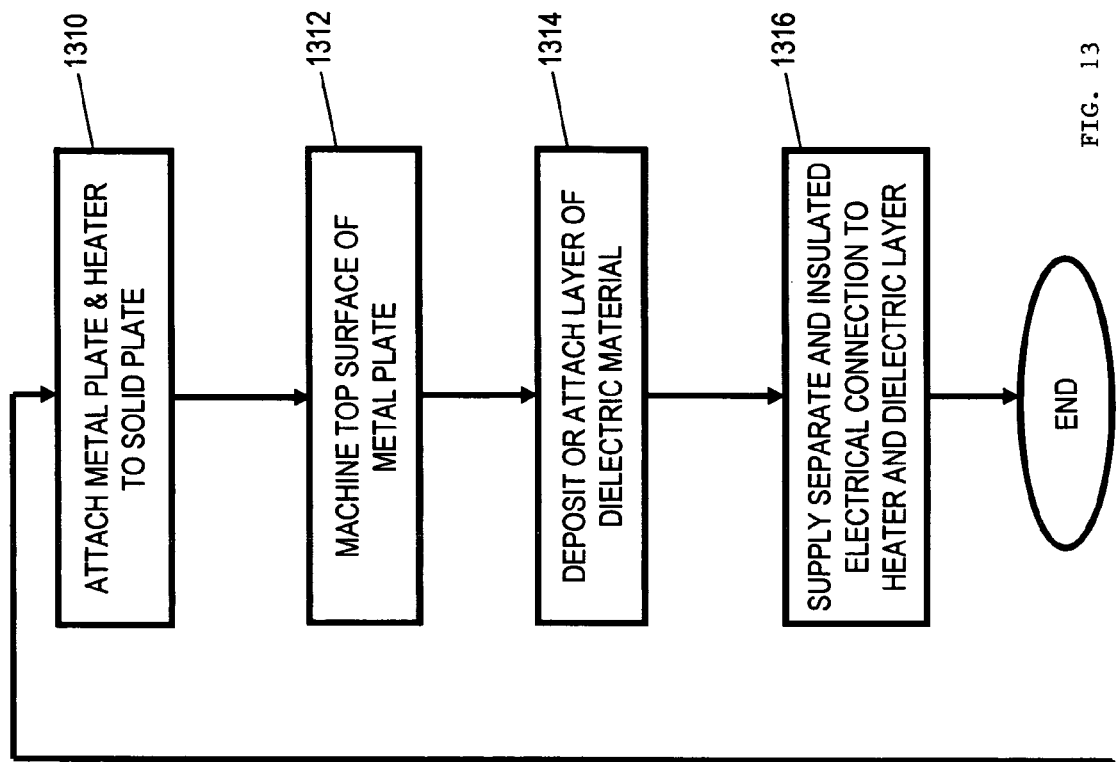
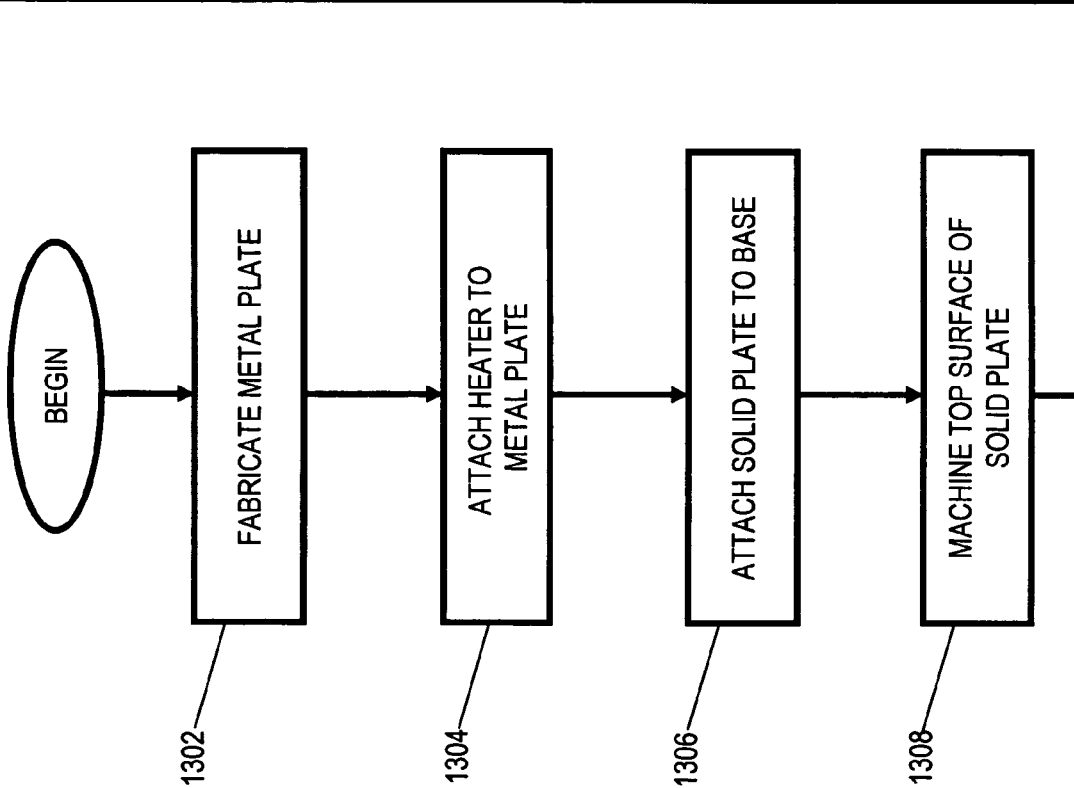
FIG. 13

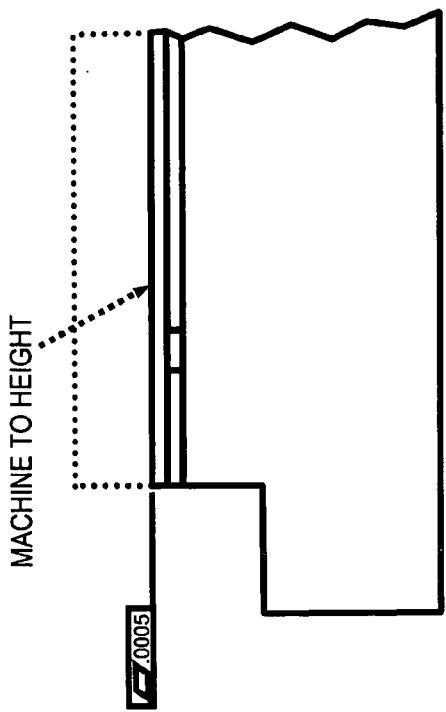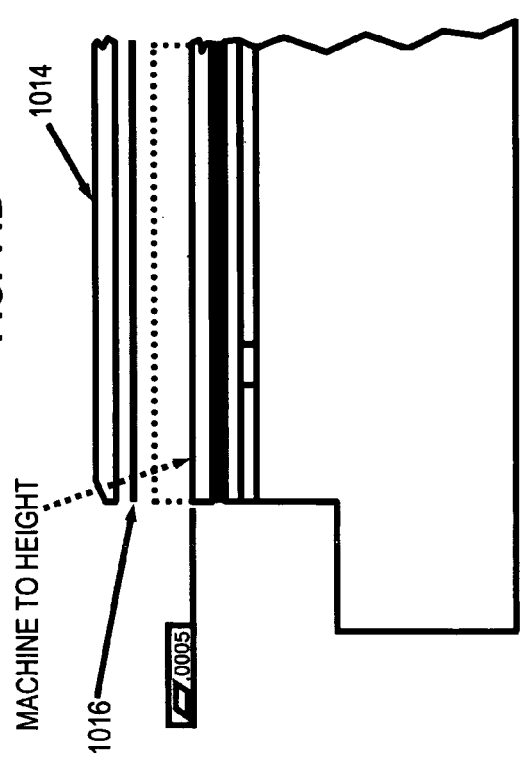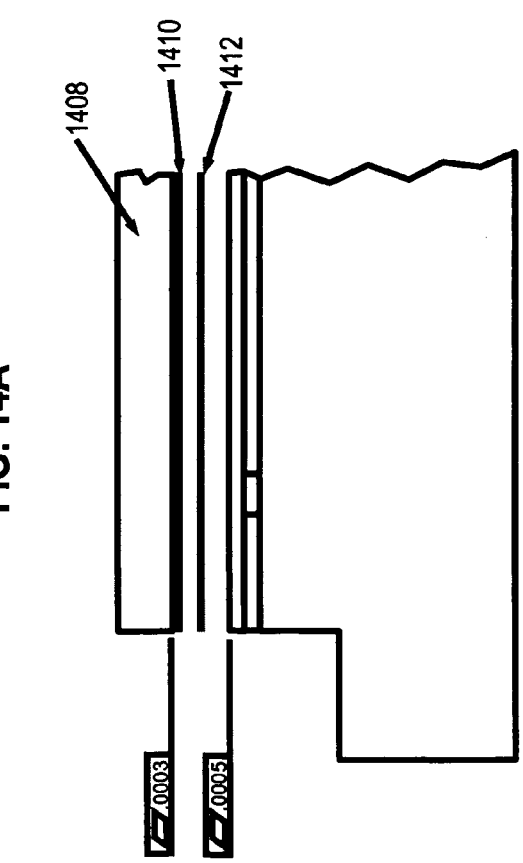

APPARATUS FOR SPATIAL AND TEMPORAL CONTROL OF TEMPERATURE ON A SUBSTRATE

FIELD OF THE INVENTION

The present invention relates to substrate supports. More particularly, the present invention relates to a method and apparatus for achieving uniform temperature distribution on a substrate during plasma processing.

BACKGROUND OF THE INVENTION

A typical plasma etching apparatus comprises a reactor in which there is a chamber through which reactive gas or gases flow. Within the chamber, the gases are ionized into a plasma, typically by radio frequency energy. The highly reactive ions of the plasma are able to react with material, such as a polymer mask on a surface of a semiconductor wafer being processed into integrated circuits (IC's). Prior to etching, the wafer is placed into the chamber and held in proper position by a chuck or holder which exposes a top surface of the wafer to the plasma. There are several types of chucks (also sometimes called susceptors) known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present invention is applicable to both types of chucks.

In a typical plasma etching operation, the reactive ions of the plasma chemically react with portions of material on a face of the semiconductor wafer. Some processes cause some degree of heating of the wafer, but most of the heating is caused by the plasma. The chemical reaction rate between the materials in the plasma and the wafer material, on the other hand, is accelerated to some degree by the temperature rise of the wafer. Local wafer temperature and rate of chemical reaction at each microscopic point on the wafer are related to an extent that harmful unevenness in etching of material over a face of the wafer can easily result if the temperature of the wafer across its area varies too much. In most cases, it is highly desirable that etching be uniform to a nearly perfect degree since otherwise the Integrated Circuit devices (ICs) being fabricated will have electronic characteristics that deviate from the norm more than is desirable. Furthermore, with each increase in the size of wafer diameter, the problem of ensuring uniformity of each batch of ICs from larger and larger wafers becomes more difficult. In some other cases, it would be desirable to be able to control the surface temperature of the wafer to obtain a custom profile.

The problem of temperature rise of a wafer during reactive ion etching (RIE) is well known, and various attempts in the past to control the temperature of a wafer during RIE have been tried. FIG. 1 illustrates one way to control wafer temperature during RIE. An inert coolant gas (such as helium or argon) is admitted at a single pressure within a single thin space 102 between the bottom of the wafer 104 and the top of the chuck 106 which holds the wafer 104. This approach is referred to as backside gas cooling.

There is generally no o-ring or other edge seal at the chuck perimeter except for a smooth sealing land extending from about 1 to 5 mm at the outer edge of the chuck 106 in order to reduce coolant leakage. Inevitably, without any elastomer seal, there is significant and progressive pressure loss across the sealing land, such that the edge of the wafer 104 is inadequately cooled. The heat generated near the edge of the wafer 104 must therefore flow significantly radially inward before it can effectively be conducted away to the chuck. The arrows 106 on top of the wafer 104 illustrate the incoming flux heating the wafer 104. The flow of the heat in the wafer 104 is illustrated with the arrows 110. This explains why the edge zone of the chuck always tends to be hotter than the rest of the surface. FIG. 2 illustrates a typical temperature distribution on the wafer 104. The pressure loss at the peripheral portions of the wafer 104 causes the wafer 104 to be much hotter at the peripheral portions.

One way of dealing with the need for zone cooling is to vary the surface roughness or to cut a relief pattern to effectively change the local contact area. Such a scheme can be used without backside coolant gas at all, in which case the contact area, surface roughness, and clamp force determine the heat transfer. However the local contact area can only be adjusted by re-machining the chuck. Another way of dealing with the need for zone cooling is to use coolant gas whose pressure is varied to increase and fine tune thermal transport. However the relief pattern is still substantially fixed. By dividing the surface of the chuck into different zones, with or without small sealing lands as dividers, and supplying separate cooling gasses to each zone, a greater degree of independent spatial control may be achieved. The gas supply to each zone may have different composition or be set to a different pressure, thus varying the thermal conduction. Each zone's operating conditions may be set under recipe control, or even dynamically stabilized during each process step. Such schemes depend on redistributing the incoming heat flux from the plasma and driving it into different regions. This is relatively effective at high power flux but will only give small temperature differentials at lower power flux. For instance, with about 3 to 6 W per $cm^2$ of uniform flux and about 3 mm sealing land, it is possible to get center to edge thermal gradients that lead to a 10° C. to 30° C. temperature increase near the wafer periphery. Thermal gradients of this magnitude can be very effective as a process control parameter. For example, radial variations in plasma density or asymmetries in a reactor layout, which can affect critical process performance metrics, are counteracted with an appropriate substrate temperature pattern. However, some processes may run at low power, for instance poly gate processes, may have a flux of only 0.2 W per $cm^2$. Unless the average conduction is made extremely low, which is very difficult to control and tends to result in inadequate overall cooling, then there will be only a very small differential of typically less than 5° C.

Accordingly, a need exists for a method and apparatus for controlling the temperature of semiconductor wafers during reactive ion etching and similar processes without requiring significant plasma heat flux. A primary purpose of the present invention is to solve these needs and provide further, related advantages.

BRIEF DESCRIPTION OF THE INVENTION

An apparatus for control of a temperature of a substrate has a temperature-controlled base, a heater, a metal plate, a layer of dielectric material. The heater is thermally coupled to an underside of the metal plate while being electrically insulated from the metal plate. The heater can be composed of multiple, independently controlled regions to impart a spatially resolved thermal pattern. Temperature feedback for each heater region is connected to appropriate power supplies, which controls their thermal output. A first layer of adhesive material bonds the metal plate and the heater to the top surface of the temperature controlled base; the adhesive possesses physical properties that allow the thermal pattern to be maintained under varying external process conditions. A second layer of adhesive material bonds the layer of dielectric material to a top surface of the metal plate. The layer of dielectric material forms an electrostatic clamping mechanism and supports the substrate. High voltage is connected to the dielectric portion to accomplish electrostatic clamping of the substrate.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 13 is a flow diagram illustrating a method for spatially and temporally controlling the temperature on a substrate during processing in accordance with another embodiment of the present invention.

FIGS. 14A, 14B, 14C, 14D are diagrams schematically illustrating a cross-sectional view of the apparatus being built in accordance with another embodiment of the present invention.

DETAILED DESCRIPTION

Figure 1:
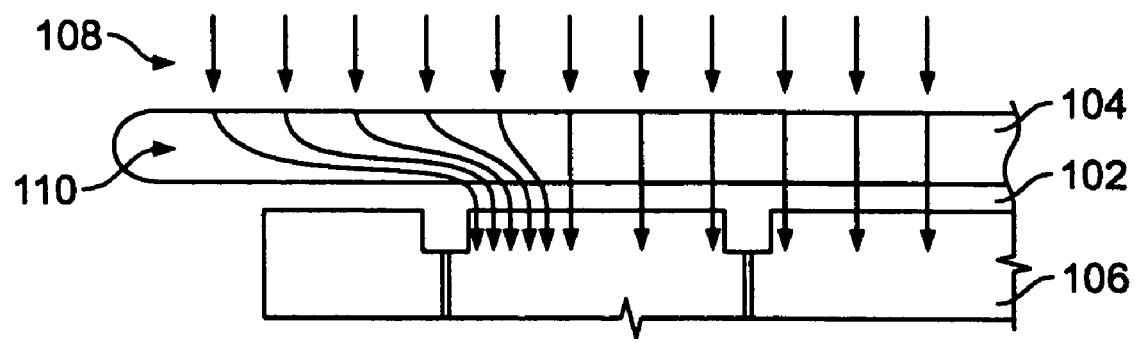
FIG. 1 is a schematic elevational diagram of a support holding a wafer under process in accordance with the prior art.
Figure 2:
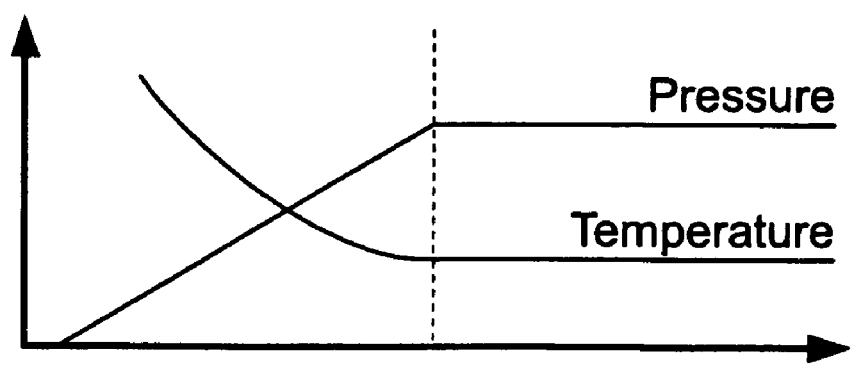
FIG. 2 is a plot illustrating the temperature of a wafer and the pressure of a coolant in the apparatus of FIG. 1 in accordance with the prior art.

Embodiments of the present invention are described herein in the context of a support for a substrate. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The tunable electrostatic chuck of the present invention is an apparatus used for controlling the processing temperature of a substrate in plasma enhanced and thermally enhanced reactions. The apparatus allows for a fixed substrate temperature to be maintained under varying amounts of external heat load from the process but also for deliberate change of temperature as a function of time. The apparatus also allows for spatially resolved temperature signatures to be imparted and maintained on the substrate during the process.

The tunable electrostatic chuck balances energy from heat sources located within the apparatus in response to the thermal energy input of the external process, thereby maintaining a desired surface temperature on the apparatus. Under static thermodynamic conditions, increasing the thermal energy from these heater sources will raise the surface temperature; decreasing the thermal energy will lower the surface temperature. Consequently, the control of the thermal energy in this way provides for temporal modification of the surface temperature. In addition, a spatially resolved heat source, i.e. a heat source with varied thermal energy as a function of location, will provide the capability of spatial temperature control. By controlling the surface temperature of the apparatus, the substrate that is well thermally coupled to the surface of the apparatus will also benefit from the same temperature control used by the apparatus.

The substrate temperature significantly affects the semiconductor process. The ability to provide temporal and spatial control of the surface temperature of the semiconductor represents a very powerful feature for device fabrication. However, the heat transfer properties of the apparatus should be spatially uniform. Failure to accomplish this heat transfer property may result in undesirable temperature signatures that cannot be corrected without employing very expensive and impractical control schemes (e.g., a very high density of individual control loops).

Figure 3:
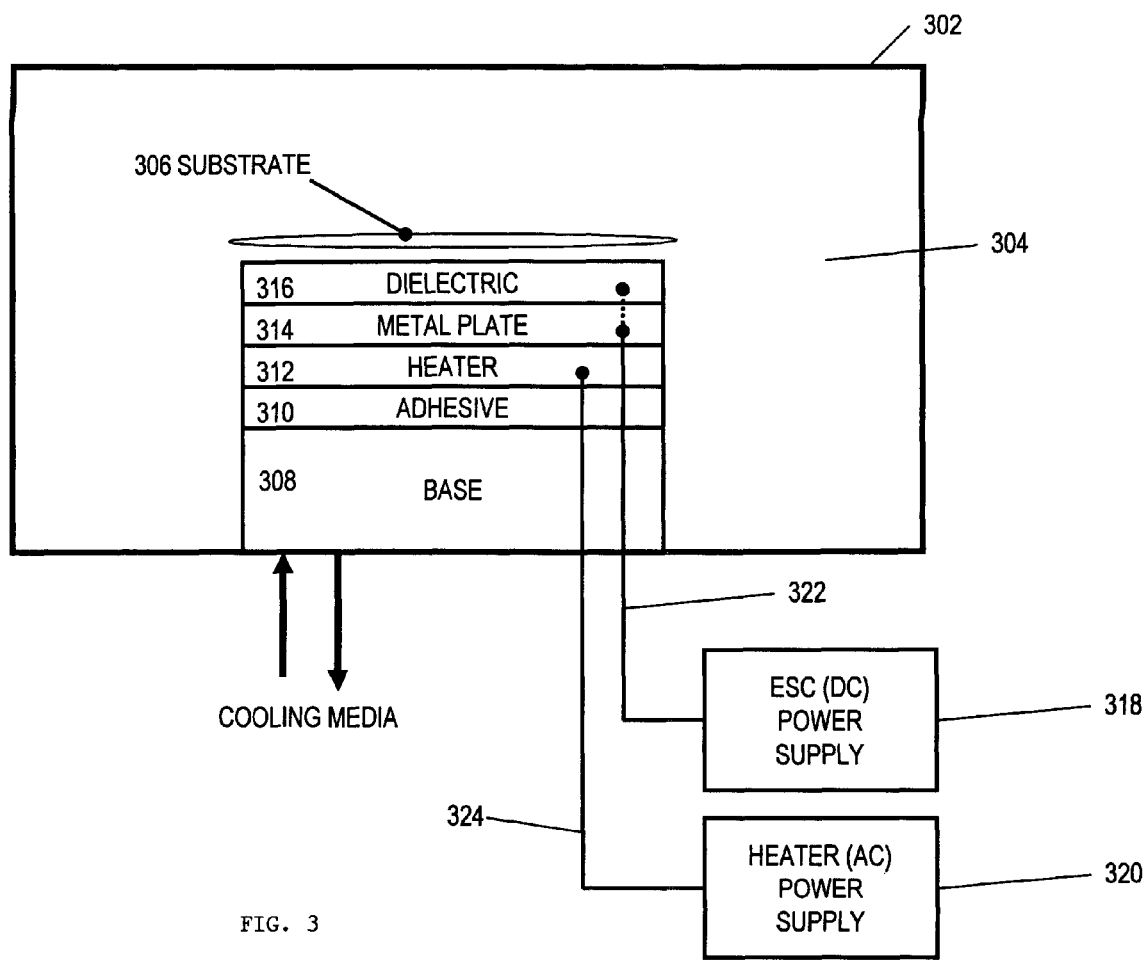
FIG. 3 is a diagram schematically illustrating a processing chamber having a base in accordance with one embodiment of the present invention.

FIG. 3 illustrates a chamber 302 having an apparatus 304 for temporal and spatial control of the temperature of a substrate 306. The apparatus 304 comprises a temperature-controlled base 308, a layer of adhesive material 310, a heater film 312, a metal plate 314, and a layer of dielectric material 316.

The base 308 may include an actively cooled metal support member that is fabricated with length and width dimensions approximating those of substrate 306. A cooling media maintains the temperature of base 308. The top surface of base 308 is machined to a high degree of flatness. In one embodiment used with 200 mm or 300 mm silicon wafer, the variation may be less than 0.0003" throughout the top surface of base 308.

The top and bottom surfaces of metal plate 314 are made of a high degree of flatness (within 0.0005" surface variation) and parallelism (within 0.0005" surface variation). The thickness of metal plate 314 is sufficient to adequately transfer the spatial pattern of a thermal heat source (such as the heater film 312) directly underneath and in intimate contact with the metal plate 314. In one embodiment, metal plate 314 may include an aluminum plate having a thickness of about 0.040".

Heater 312 may be a thin and flexible polyimide heater film bonded to the bottom side of metal plate 314. Heater 312 may be constructed of multiple resistive elements, with a pattern layout designed to accomplish spatial temperature control on the surface of the finished assembly. To prevent any potential electrical problems, the heating elements are electrically insulated from metal plate 314. Flexible heater 312 is in intimate contact with metal plate 314. In one embodiment, heater 312 includes a polyimide heater film having a thickness of about 0.010" with a surface variation within 0.0005".

Figure 4:
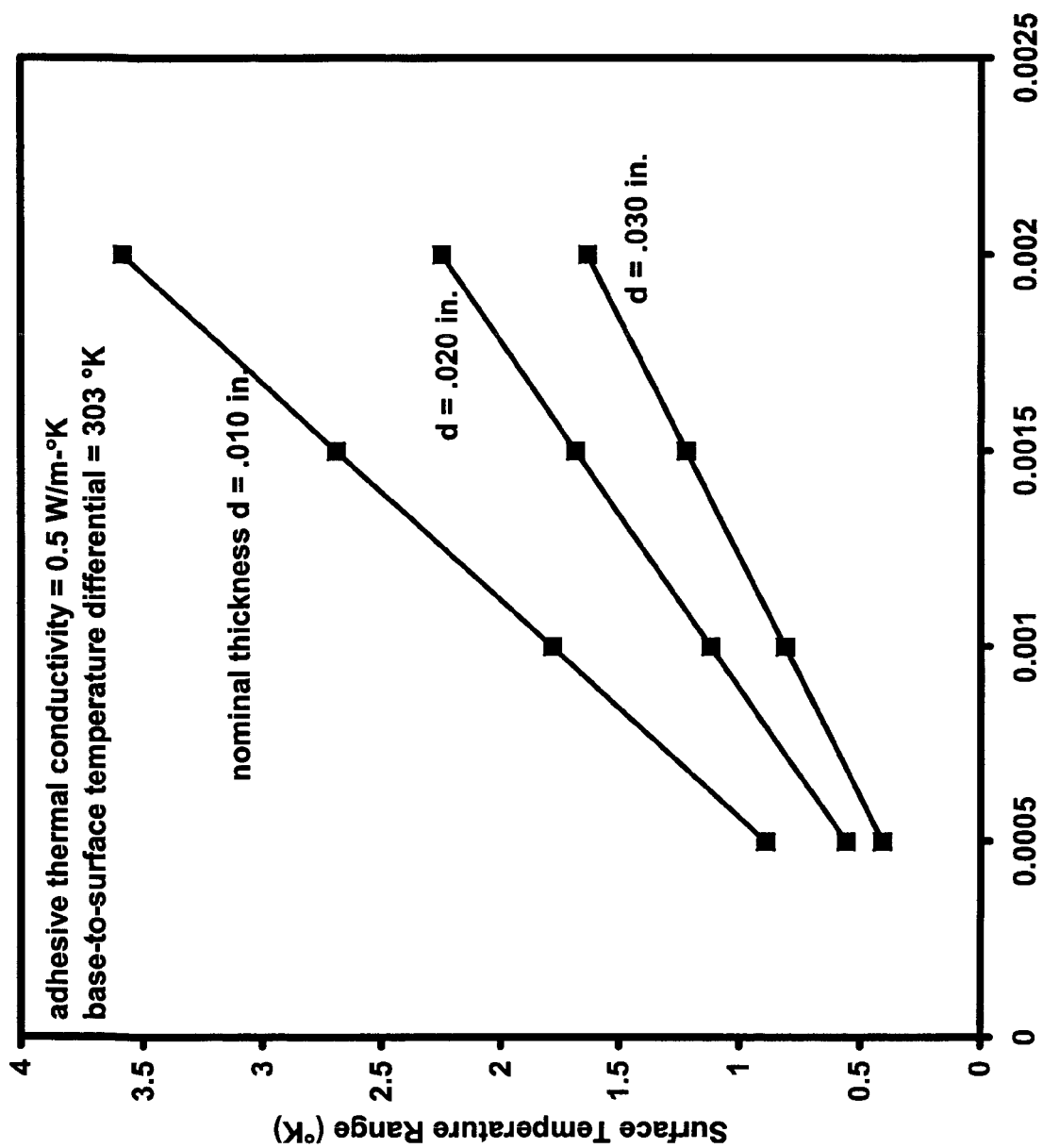
FIG. 4 is a table illustrating the relationship between surface temperature range and parallelism of the layers in accordance with one embodiment of the present invention.

Both metal plate 314 and heater 312 are attached to base 308 using a uniformly deposited, mechanically flexible adhesive 310. Metal plate 314 and base 308 are separated by this layer of adhesive material 310 with a high degree of parallelism. The layer of adhesive material 310 has height dimension and thermal conductivity that defines an appropriate heat transfer between heating elements 312 and the external process. The heat transfer coefficient may be determined by the relative power levels employed by the heating elements and external process. In one embodiment, the layer of adhesive material 310 may include a silicone bond layer having a thermal transfer coefficient of about 0.17 W/m-° K to about 0.51 W/m-° K. In one embodiment, the thickness of the layer of adhesive material 310 may range from about 0.013" to about 0.040" with thickness variation (i.e., parallelism) within 0.001". The importance of the thickness variation requirement is illustrated by the graph in FIG. 4. For a fixed heat transfer coefficient (defined by nominal adhesive layer thickness and adhesive layer thermal conductivity), the resulting surface temperature non-uniformity will increase with increasing parallelism. To avoid problems with device fabrication resulting from unwanted thermal non-uniformities, the adhesive layer thickness variation must be minimized, thereby implying an apparatus whose design can achieve this requirement.

Returning to FIG. 3, a thin layer of dielectric material 316 may be deposited (via CVD, spray-coating, etc . . . ) on the top surface of metal plate 314 to form an electrostatic clamping mechanism. Those of ordinary skills in the art will recognize that any conventionally used material with high field breakdown strength and chemical resistance to the external process can be employed (e.g., aluminum oxide, aluminum nitride, yttrium oxide, etc.). The thickness and surface condition of the layer of dielectric material 316 may be defined so that the holding force and heat transfer characteristics impart the spatial temperature pattern of the metal plate 314 to the substrate 306. In one embodiment, the layer of dielectric material 316 has a thickness of about 0.002" with a top surface variation within 0.001".

Separately insulated electrical connections 322 and 324 may be made to the heating elements of heater 312, and metal plate 314 (which is coupled to the dielectric material 316) so as to provide control of these features with independent power supplies respectively Electrostatic Chuck (ESC) power supply 318 and heater power supply 320. An example of the insulated electrical connections are illustrated and later described in FIG. 10.

Figure 5:
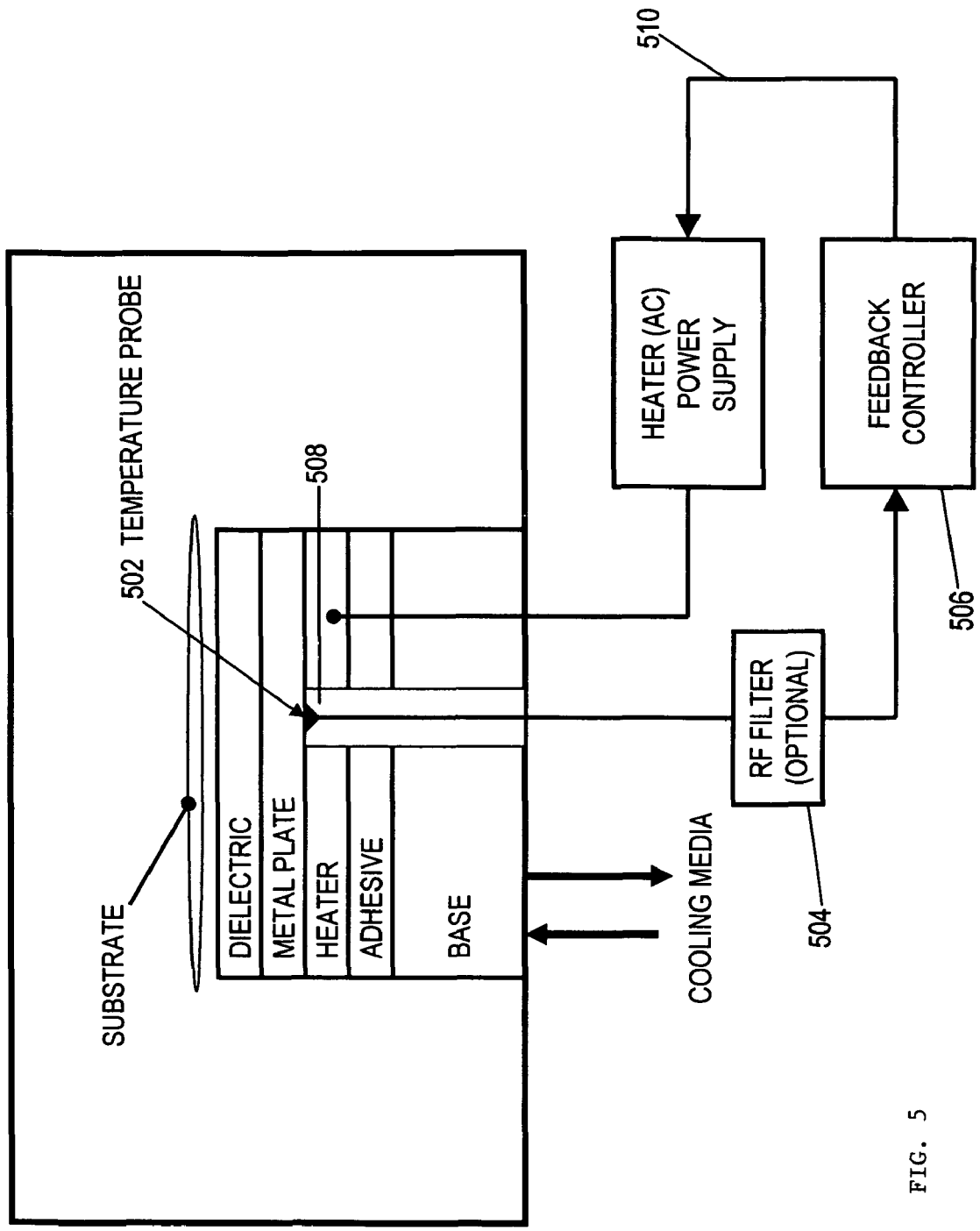
FIG. 5 is a diagram schematically illustrating the apparatus surface temperature control scheme in accordance with one embodiment of the present invention.

Regional control of surface temperature is accomplished with one or more measurement probes that contact the metal plate through penetrations 508 in the underlying layers, shown in FIG. 5. The probe 502 is part of a feedback loop 506 for control of one or more heating elements 510; the probe output can be passed through a filtering scheme 504, if necessary, to eliminate any radio frequency noise on the measurement signal should the apparatus be operated in an environment containing radio frequency power. Given the small height dimension of the metal plate previously defined—necessary for adequate transfer of heater thermal pattern to the surface of the apparatus—a suitably accurate estimate of the surface temperature can thereby be acquired.

Figure 6:
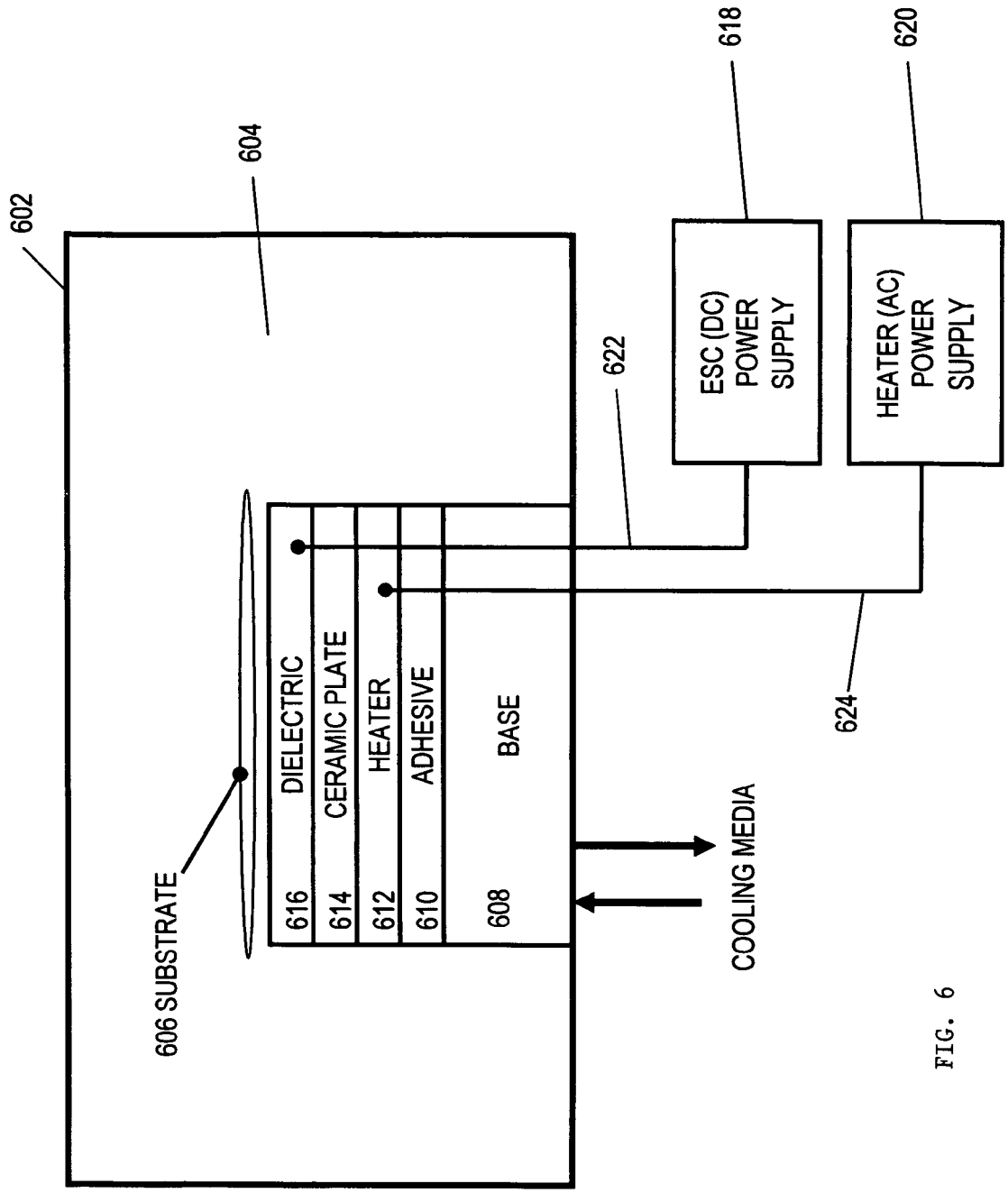
FIG. 6 is a diagram schematically illustrating a processing chamber having a base in accordance with another embodiment of the present invention.

FIG. 6 illustrates another embodiment of a chamber 602 having an apparatus 604 for temporal and spatial control of the temperature of a substrate 606. The apparatus 604 comprises a temperature controlled base 608, a layer of adhesive material 610, a heater film 612, a ceramic plate 614, and a layer of dielectric material 616. A cooling media maintains the temperature of base 608. A first power supply 620 supplies electrical power to heater 612 via electrical connector 624. A second power supply supplies electrical power to the layer of dielectric material 616 via electrical connector 622. Base 608, layer of adhesive material 610, heater 612, and layer of dielectric material 616 were previously described in FIG. 3. An example of the electrical connections is also illustrated and later described in FIG. 10. Heater 612 is deposited to the underside of a ceramic plate 614 instead of metal plates 314, as described in FIG. 3. Ceramic plate 614 may include, for example, aluminum nitride or aluminum oxide. The thickness of ceramic plate 614 is such that it adequately transfers the special pattern of the thermal heat source (heater 612) directly underneath and in intimate contact with ceramic plate 614. Heater 612 does not have to be electrically insulated from the ceramic plate 614. In one embodiment, base 608 has a top surface variation of about 0.0003". The thickness of layer of adhesive material 610 may range from about 0.013" to about 0.040" with a top and bottom surface variation within 0.0003" and a parallelism (top surface variation—bottom surface variation) of within 0.001". Heater 612 has a thickness of about 0.010" with a bottom surface variation within 0.0005". Ceramic plate 614 has a thickness of about 0.040" with top surface variation within 0.0005" and a bottom surface variation within 0.0002". Layer of dielectric material 616 (which is coated on ceramic plate 614) has a thickness of about 0.002" with a top surface variation within 0.001". The layer of dielectric material 616 may be deposited (via CVD, spray-coating, etc . . . ) on the surface of heater plate 614 (made of metal or ceramic). A conductive material of suitable properties would also need to be deposited to form a clamping electrode.

Figure 7:
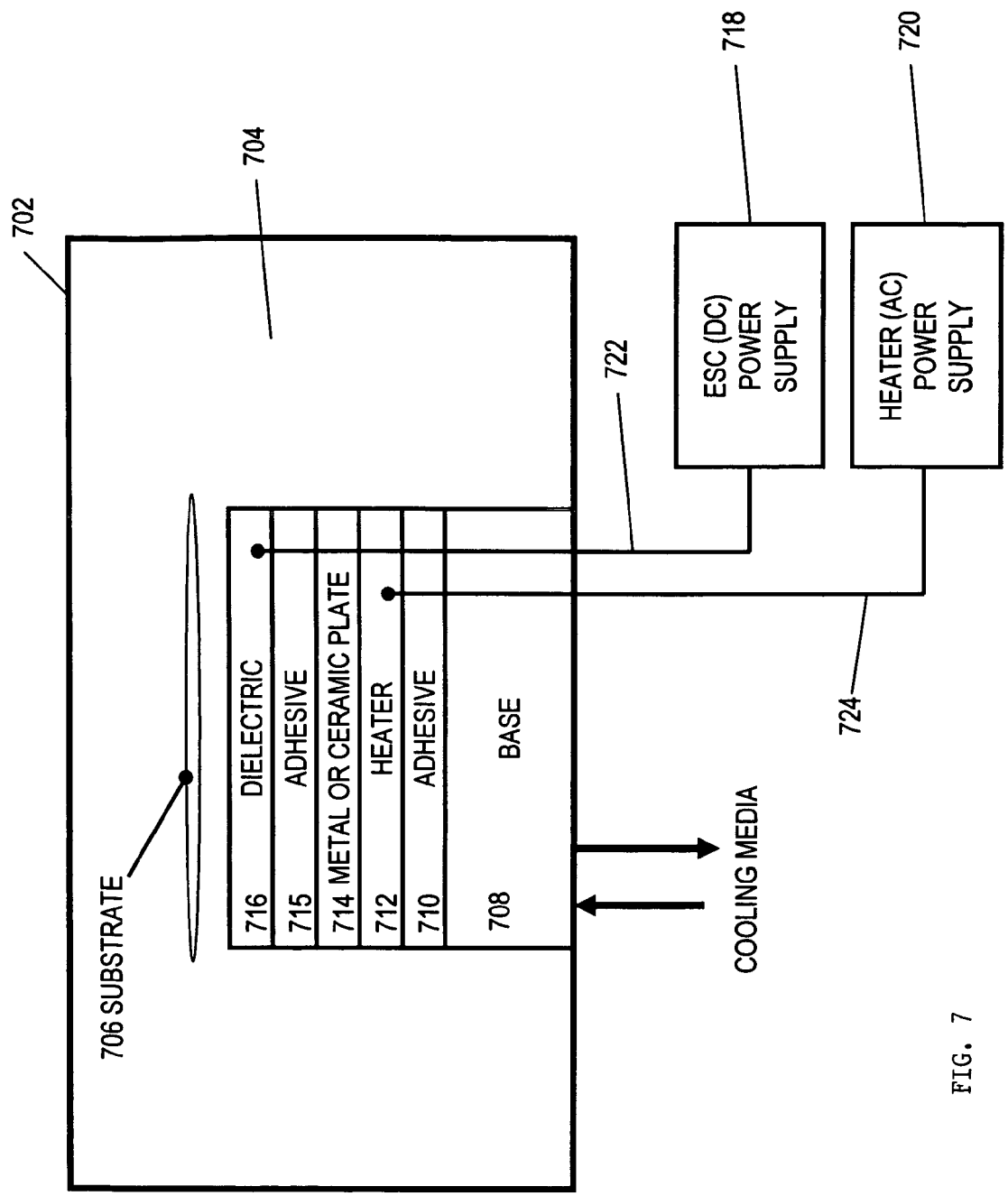
FIG. 7 is a diagram schematically illustrating a processing chamber having a base in accordance with yet another embodiment of the present invention.

FIG. 7 illustrates another embodiment of a chamber 702 having an apparatus 704 for temporal and spatial control of the temperature of a substrate 706. The apparatus 704 comprises a temperature controlled base 708, a layer of adhesive material 710, a heater film 712, a ceramic or metal plate 714, a layer of adhesive material 715, and a layer of dielectric material 716. A cooling media maintains the temperature of the base 708. A first power supply 720 supplies electrical power to the heater 712 via electrical connector 724. A second power supply 718 supplies electrical power to the layer of dielectric material 716 via electrical connector 722. The base 708, the layers of adhesive material 710, 715, and the heater 712 were previously described in FIGS. 3 and 6. The heater 712 is deposited to the underside of a ceramic or metal plate 714. The dielectric layer 716 is a separate component containing a conductive electrode and appropriate insulating films to form an electrostatic clamping mechanism, may have a thickness of about 0.040", and may have a top and bottom surface variation within 0.001". The separate and pre-fabricated layer of dielectric material 716 is attached to the metal or ceramic plate 714 using a layer of adhesive material 715. An example of the electrical connections is also illustrated and described in FIG. 10.

Figure 8:
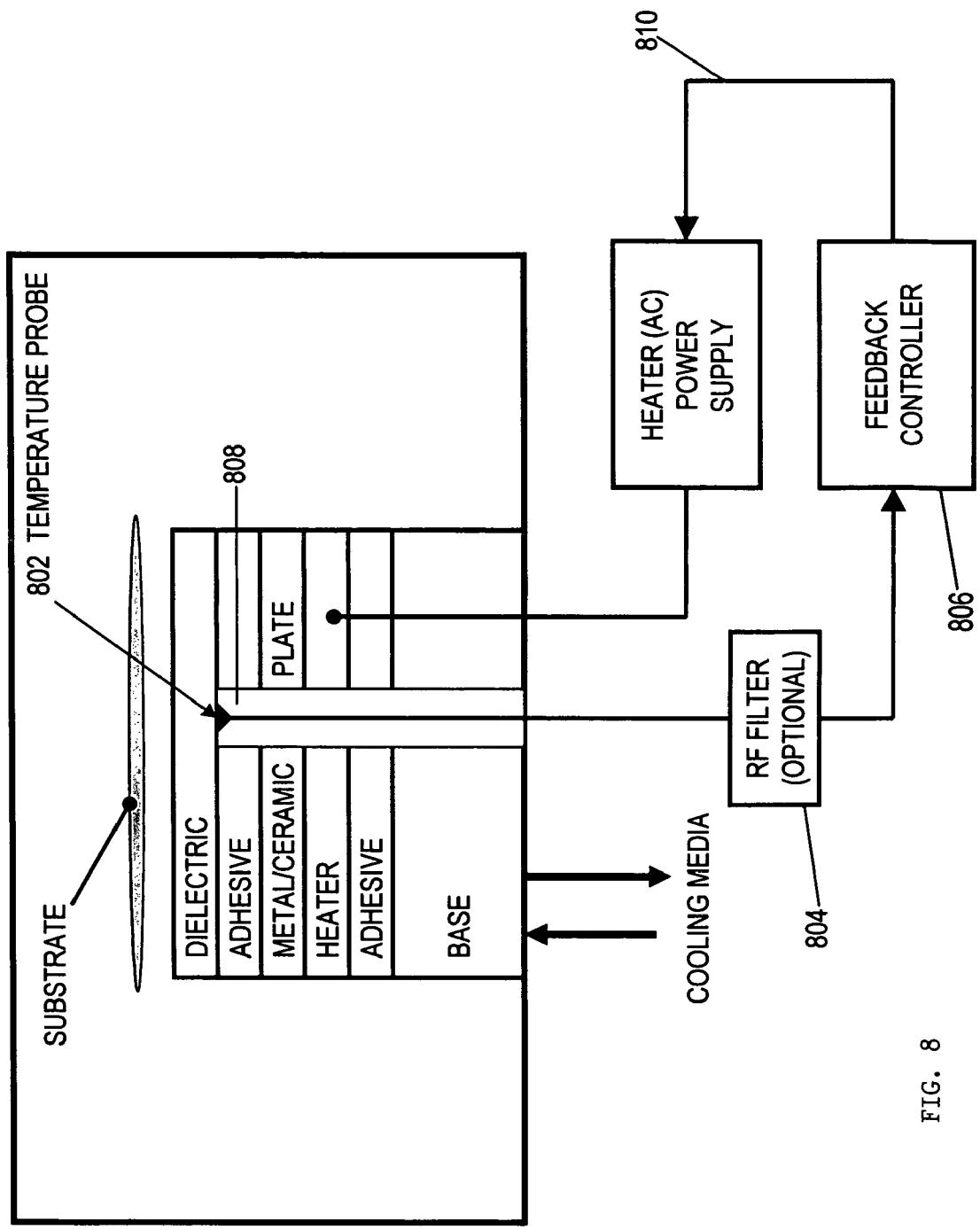
FIG. 8 is a diagram schematically illustrating the apparatus surface temperature control scheme in accordance yet another embodiment of the present invention.

Regional control of surface temperature is accomplished with one or more measurement probes 802 that contact the dielectric plate through penetrations 808 in the underlying layers, shown in FIG. 8. The probe 802 is part of a feedback loop 806 for control of one or more heating elements 810; the probe output can be passed through a filtering scheme 804, if necessary, to eliminate any radio frequency noise on the measurement signal should the apparatus be operated in an environment containing radio frequency power. Given the small height dimension of the dielectric layer previously defined—necessary for adequate transfer of heater thermal pattern to the surface of the apparatus—a suitably accurate estimate of the surface temperature can thereby be acquired.

Figure 9:
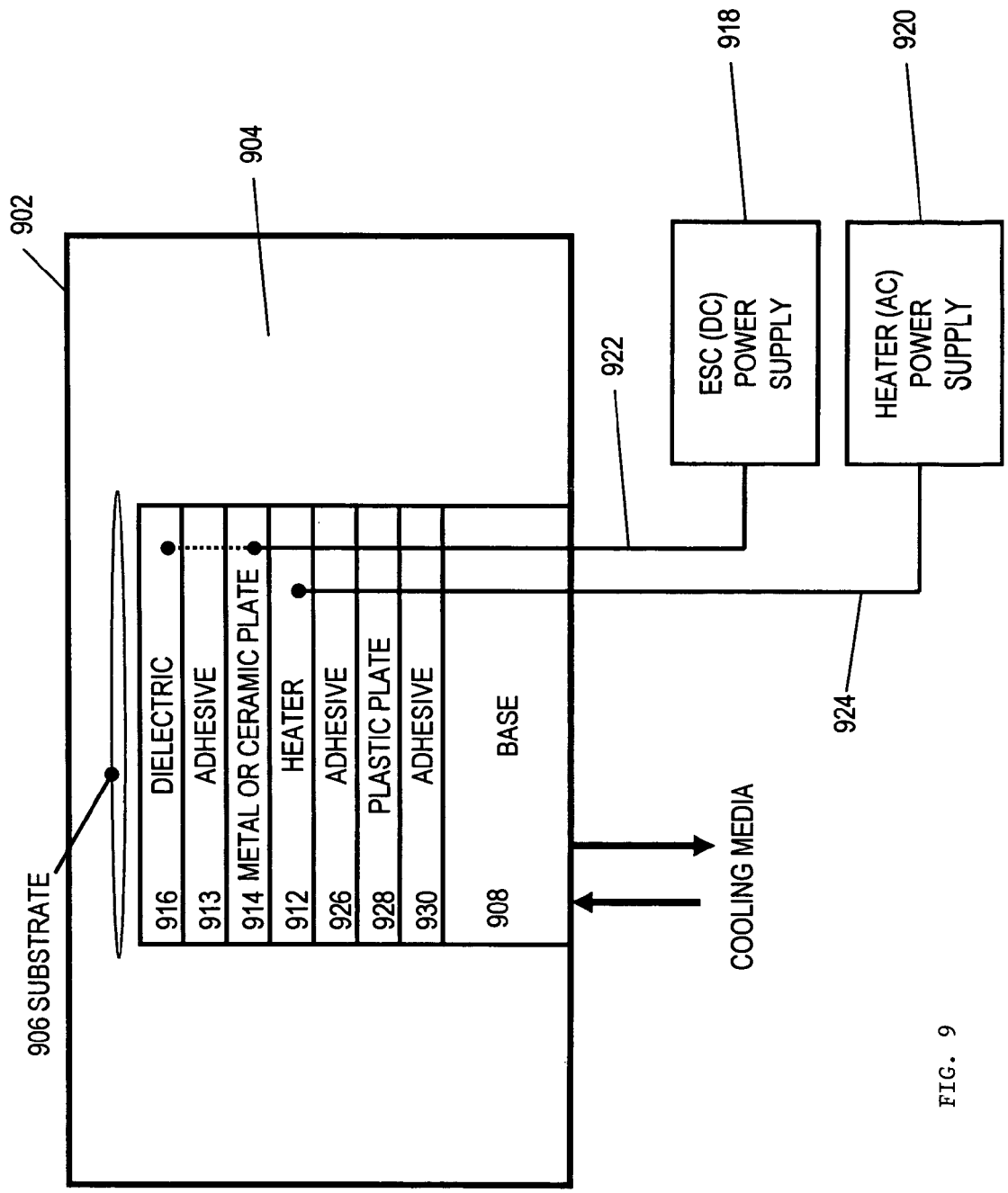
FIG. 9 is a diagram schematically illustrating a processing chamber having a base in accordance with yet another embodiment of the present invention.

FIG. 9 illustrates another embodiment of a chamber 902 having an apparatus 904 for temporal and spatial control of the temperature of a substrate 906 in which the layer of adhesive material 910 includes a top layer of bonding material 926, a solid plate 928, and a bottom layer of bonding material 930. The apparatus 904 comprises a temperature-controlled base 908, a layer of adhesive material 910, a heater film 912, a metal or ceramic plate 914, a layer of adhesive material 913, and a layer of dielectric material 916. In one embodiment, base 908 has a top surface variation within 0.0003". Heater film 912 may have a thickness of about 0.010" with a bottom surface variation within 0.0005". Metal or ceramic plate 914 may have a thickness of about 0.040" with a top surface variation within 0.0005" and a bottom surface variation within 0.0002". Layer of adhesive material 913 may have a thickness of about 0.004". Layer of dielectric material 916 may have a thickness of about 0.040" with a top and bottom surface variation within 0.001".

A cooling media maintains the temperature of base 908 constant. A heater power supply 920 supplies electrical power to heater 912 via electrical connector 924. A ESC power supply 918 supplies electrical power to the metal plate 913 or to dielectric material 916 via electrical connector 922. Base 908, metal or ceramic plate 914, heater 912, layer of adhesive material 913, and layer of dielectric material 916 were previously described. An example of the electrical connections is also illustrated and later described in FIG. 10.

The layer of dielectric material 916 may be deposited (via CVD, spray-coating, etc . . . ) on the surface of heater plate 914 (made of metal or ceramic). If a metal plate is used, this same plate may be employed for the clamp electrode. If a ceramic plate is used, then a conductive material of suitable properties would also need to be deposited to form a clamping electrode.

Solid plate 928 sandwich between top layer of adhesive material 926 and bottom layer of adhesive material 930 is made of a plastic material (such as Vespel® or Torlon®). In one embodiment, the thickness of solid plate 928 may range from about 0.006" to about 0.020" with a top and bottom surface variation (parallelism) within 0.001". The thermal conductivity of solid plate 928 may be about 0.17 W/mK. The thermal conductivity of solid plate 928 may be substantially similar to the thermal conductivity of the top and bottom layer of adhesive material 926 and 930. The thermal conductivity of solid plate 928 may be determined by the relative power levels employed by heating elements 912 and external process. The top layer of adhesive material 926 may have a thickness of about 0.004" with a surface variation within 0.0005". The bottom layer of adhesive material 930 may have a thickness ranging from about 0.006" to about 0.020" with a top and bottom surface variation (parallelism) within 0.001". The bottom surface of solid plate 928 is thus attached to base 908 with mechanically flexible adhesive 930. The top surface of solid plate 928 is thus attached to heater 912 and metal or ceramic plate 914 with mechanically flexible adhesive 926. In another embodiment, the top surface of solid plate 928 may be machined to a surface variation within 0.0005".

Figure 10:
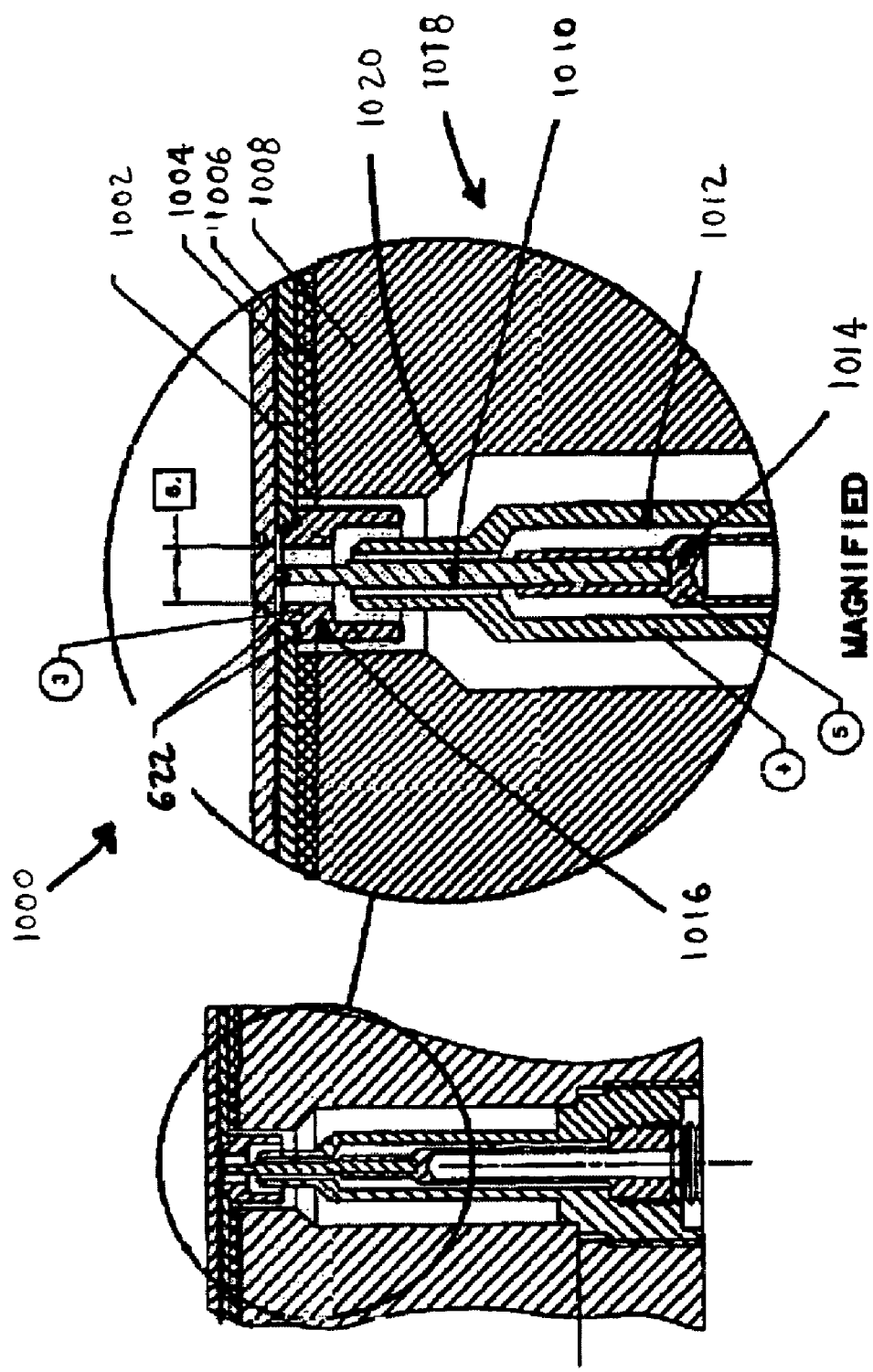
FIG. 10 is a diagram schematically illustrating a cross-sectional view of an electrical connector in accordance with one embodiment of the present invention.

FIG. 10 illustrates a cross-sectional view of an electrical connector 1000 supplying electrical power to a layer of dielectric material (Electrostatic Chuck—ESC) 1002. A pin assembly 1018 comprises a socket 1014, a spring-loaded pin 1010, and a plastic insulator 1012. The ESC power supply (not shown) is electrically coupled to the pin holder/socket 1014 forming the base of the vertical spring-loaded pin 1010. The top end of the pin 1010 comes into electrical contact with a bottom surface of the layer of dielectric material 1002. The plastic insulator 1012 forms a shaft enclosing the socket 1014 and partially enclosing the spring loaded pin 1010. The top end tip of the spring-loaded pin 1010 vertically protrudes out of the plastic insulator 1012. A portion of the heater layer 1004, the adhesive layer 1006, and the base 1008 form a contiguous cavity 1020 in which the pin assembly 1018 resides.

A non-electrically conductive bushing 1016 encloses a portion of the top end of the pin 1010 partially including a top end of the plastic insulator 1012. The top part of the bushing 1016 is coupled to the heater layer 1004 with a bonding material 1022 such as silicone adhesive. The bushing 1016 minimizes any anomalous thermal effects caused by the physical contact between the dielectric material 1002 and the top end of the pin 1010. The dielectric material 1002 is heated by the heater 1004. The cooled base 1008 surrounds the pin assembly 1018. The bushing 1016 minimizes the amount of heat drawn from the dielectric material 1002 towards the base 1008 via the pin assembly 1018. The cavity 1020 is large enough to provide added space insulation between the walls of the base 1008 and the outer surface of the plastic insulator 1012.

Figure 11:
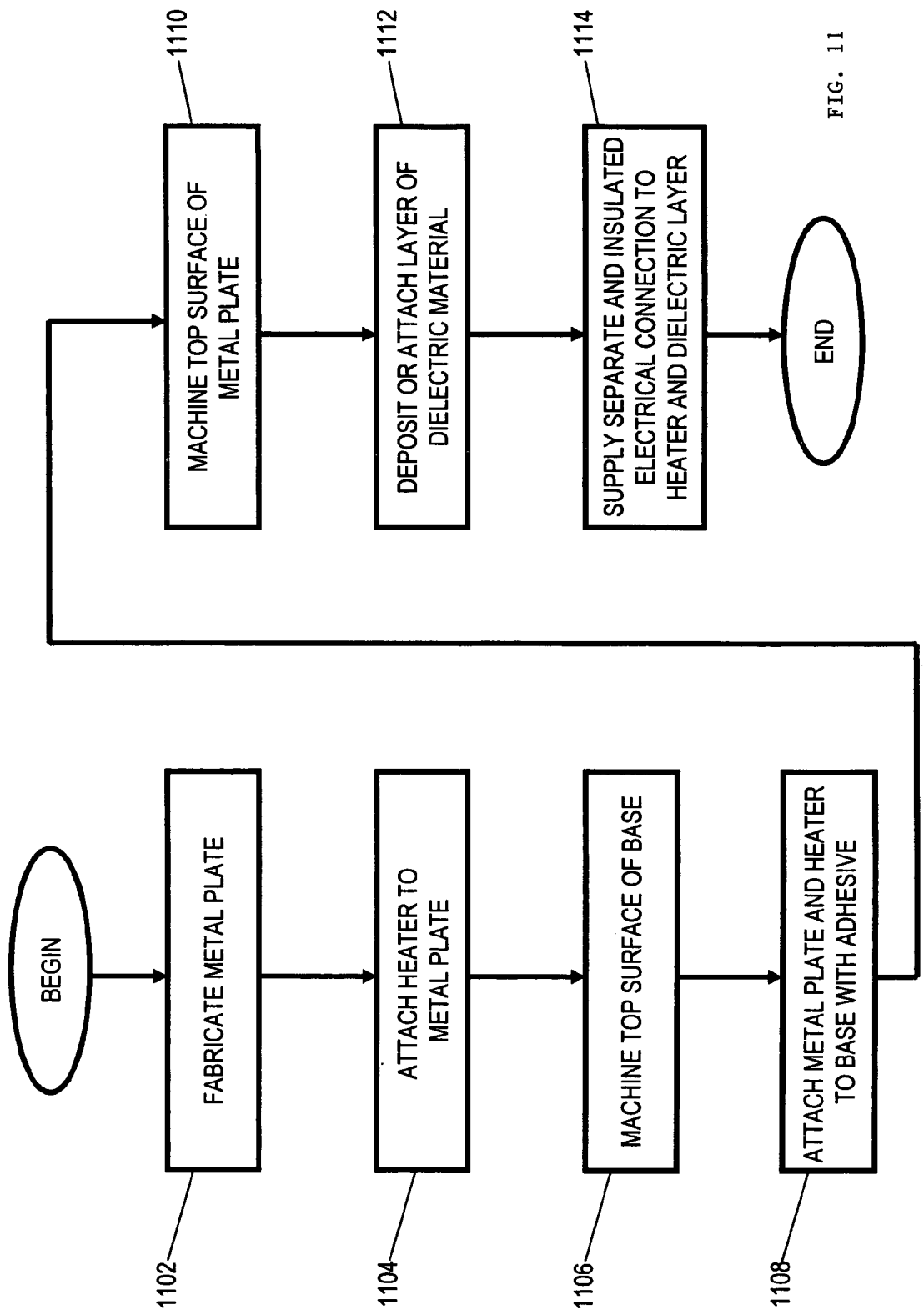
FIG. 11 is a flow diagram schematically illustrating a method for spatially and temporally controlling the temperature on a substrate during processing in accordance with one embodiment of the present invention.

FIG. 11 illustrates a flow diagram of a method for controlling the temporal and spatial temperature of a substrate. At 1102, a metal plate is fabricated with length and width dimensions substantially equal to the base. The top and bottom surfaces of the metal plate are made of a high degree of flatness and parallelism, for example, within 0.005" surface variation. In another embodiment, a ceramic plate may be substituted for the metal plate.

At 1104, a heater is bonded to an underside of the metal plate. The heater may include a thin and flexible heater film bonded to the bottom side of the metal plate. The heater may also include multiple resistive elements, with a pattern layout designed to accomplish spatial temperature control on the surface of the finished assembly. For example, regional thermal zone may be defined by one or more resistive elements; the heater may include elements defining a radially outer region and a radially inner region. To prevent any potential electrical problems, the heating elements are electrically insulated from the metal plate. The heater is in intimate thermal contact with the metal plate.

Before attaching the heater and metal plate assembly to a base. At 1106, the top surface of the base is machined down to a high degree of flatness, for example, within 0.0003" surface variation. At 1108, the heater and metal plate assembly are attached to the top surface of the base with a layer of adhesive material.

In accordance with another embodiment, at 1110, the metal plate may be further machined down after attachment to the base to provide a high degree of flatness. In one embodiment, the top surface variation of the metal plate after machining is within 0.0005".

At 1112, a thin layer of dielectric material 316 may be deposited on the top surface of the metal plate to form an electrostatic clamping mechanism. Those of ordinary skill in the art will now recognize that any conventionally used material with high field breakdown strength and chemical resistance to the external process can be used for dielectric material 316 (e.g., aluminum oxide, aluminum nitride, yttrium oxide, etc.). In accordance with another embodiment, the dielectric material may be pre-fabricated and attached to the top surface of the metal plate with a layer of adhesive material.

At 1114, separately insulated electrical connections may be made to the heating elements of the heater and the metal plate (which is coupled to the dielectric material) so as to provide control of these features with independent power supplies. The electrical connection may be accomplished using the electrical connector previously described illustrated in FIG. 10.

Figure 12A:
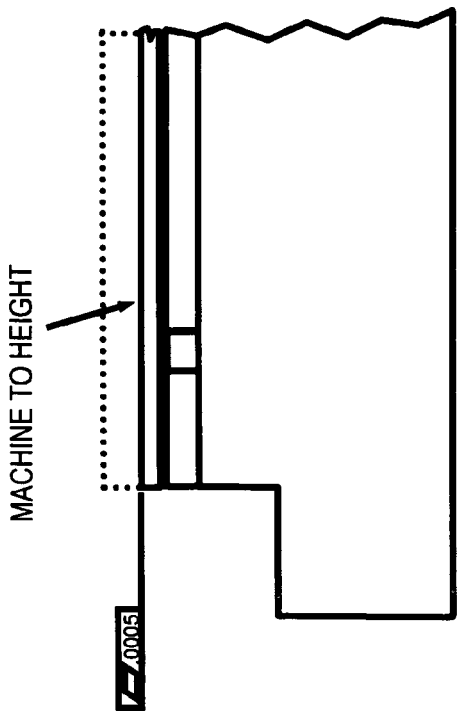
FIGS. 12A, 12B, 12C are diagrams schematically illustrating a cross-sectional view of the apparatus being built in accordance with one embodiment of the present invention.
Figure 12B:
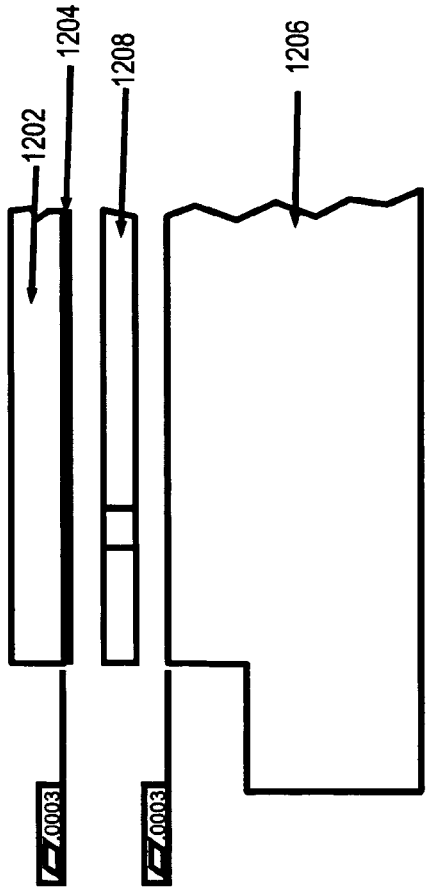
Figure 12C:
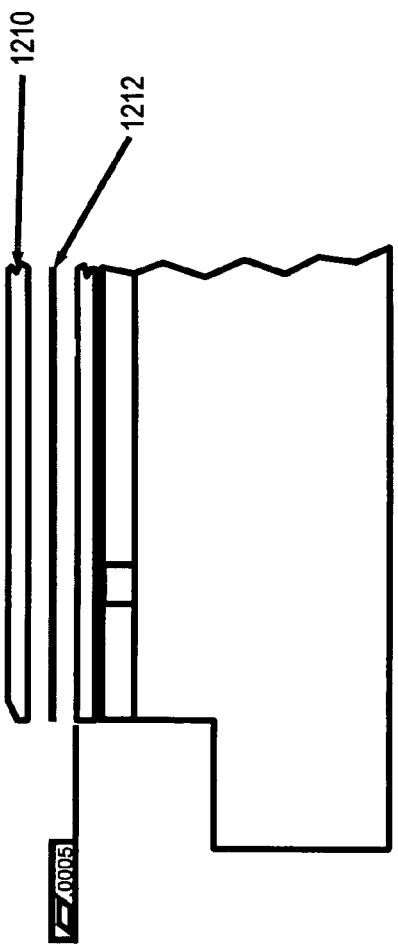

FIGS. 12A, 12B, and 12C illustrate the method described in the flow diagram of FIG. 11. FIG. 12A illustrates a metal plate 1202 and the attached heater 1204 assembly being bonded to a base 1206 using a layer of adhesive material 1208 as previously described at 1108. FIG. 12B illustrates the top surface of the metal plate 1202 being machine down a height of about 0.040" with a top surface variation within 0.0005" after being attached to base 1206. FIG. 12C illustrates a layer of dielectric material 1210 being attached to the top surface of metal plate 1202 with a layer of silicone bonding material 1212. Alternatively, the layer of dielectric material 1210 may be applied directly on the metal plate 1202, using conventional deposition techniques, thereby eliminating the silicone bonding material 1212.

FIG. 13 illustrates a flow diagram of a method for controlling the temporal and spatial temperature of a substrate. At 1302, a metal plate is fabricated in a similar manner as previously described at 1102 in FIG. 11. At 1304, a heater is bonded to an underside of the metal plate in a similar manner as previously described at 1104 in FIG. 11.

At 1306, the bottom surface of a solid plate such as a plastic plate is attached to the top surface of a base with a layer of adhesive material. At 1308, the top surface of the plastic plate is machine down to improve the degree of flatness and parallelism. In one embodiment, the solid plate may have a thickness ranging from about 0.006" to about 0.020" with a surface variation within 0.0005".

At 1310, the metal plate and heater assembly is attached to the top surface of the plastic plate with a layer of adhesive material. Alternatively, the layer of dielectric material may be applied directly on the metal plate, using conventional deposition techniques, thereby eliminating the silicone bonding material.

At 1312, the top surface of the metal plate may also be machined down after attachment to the base. This was previously described at 1110 in FIG. 11.

At 1314, the layer of dielectric material (ESC ceramic) is attached to the top surface of the metal plate with a layer of adhesive material. This was previously described at 1112 in FIG. 11.

At 1316, separately insulated electrical connections may be made to the heating elements of the heater and the metal plate (which is coupled to the dielectric material) so as to provide control of these features with independent power supplies. This was previously described at 1114 in FIG. 1. The electrical connection may be accomplished using the electrical connector previously described and illustrated in FIG. 10.

FIGS. 14A, 14B, 14C, and 14D illustrate the method described in the flow diagram of FIG. 13. FIG. 14A illustrates a plastic plate 1402 being bonded to a base 1404 using a layer of adhesive material 1406 corresponding to 1306 in FIG. 13. FIG. 14B illustrates the top surface of the plastic plate 1402 being machined down to a height ranging from about 0.006" to about 0.020" after being attached to the base 1404 so as to achieve a top surface variation within 0.0005". FIG. 14C illustrates a metal plate 1408 and heater 1410 assembly being attached to the top surface of the plastic plate 1402 with a layer of adhesive material 1412 corresponding to 1310 in FIG. 13. FIG. 14D illustrates the top surface of the metal plate 1408 being machined down to a thickness of about 0.040" with a top surface variation of about 0.0005". The layer of dielectric material 1414 is attached to the top surface of the metal plate 1408 with a layer of adhesive material 1416 corresponding to 1314 in FIG. 13.

Figure 15:
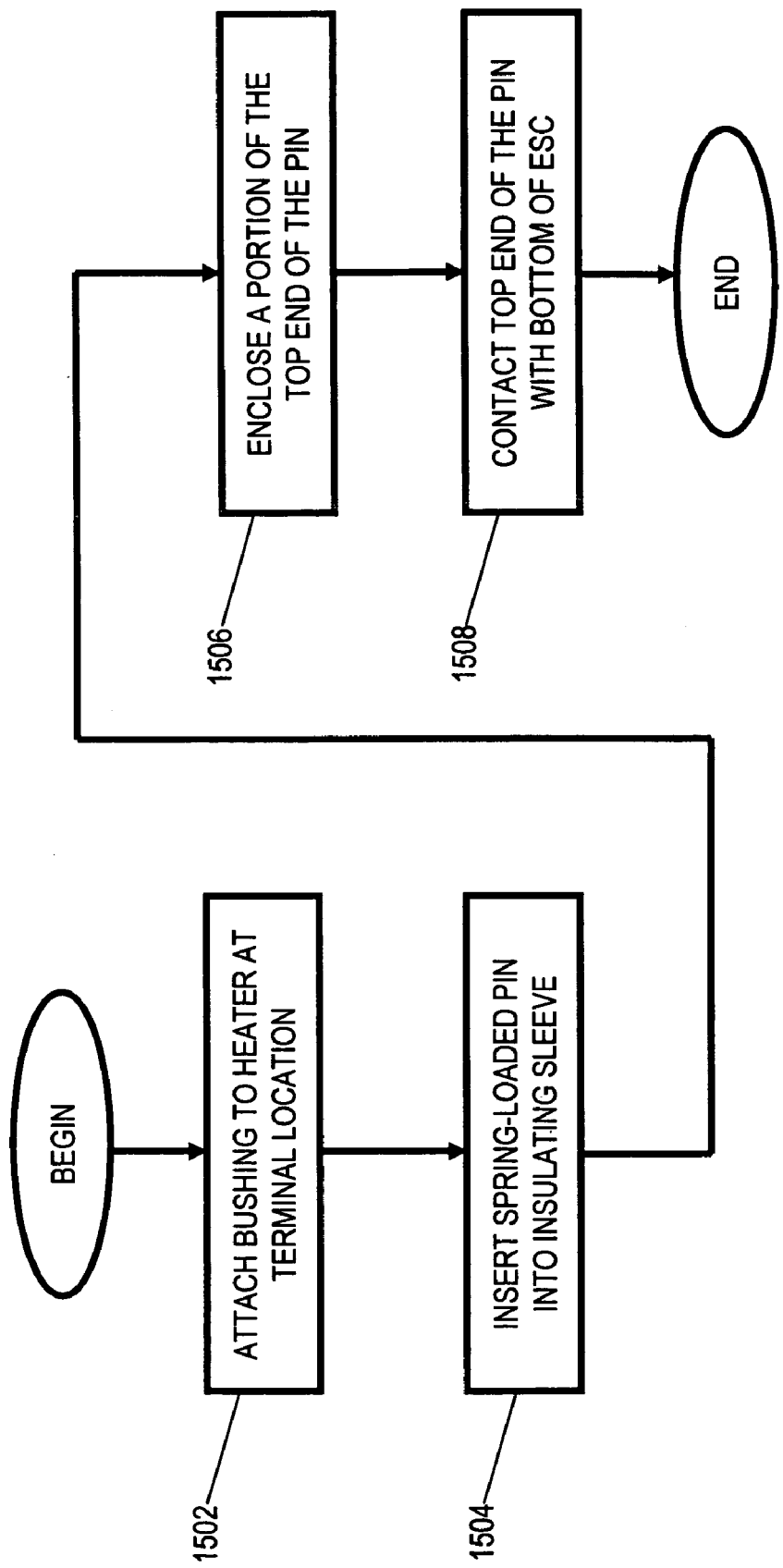
FIG. 15 is a flow diagram schematically illustrating a method for electrically connecting a power supply to a heater and an electrostatic electrode in a base in accordance with one embodiment of the present invention.

FIG. 15 illustrates a method for electrically connecting an electrical terminal of the electrostatic clamp of a wafer support having a base, a bonding layer, a heater and a metal plate. At 1502, the non-electrically conductive bushing is attached to the heater at the location defined by one of the electrostatic clamp's electrical terminations. At 1504, the spring-loaded pin is disposed within an insulating sleeve that exposes the tip of the pin. At 1506, the pin with insulating sleeve is disposed in a cavity formed by the base, bonding layer, heater and metal plate, whereby the top portion of the sleeve overlaps the bottom portion of the bushing. At 1508, a top end of the electrical connector including a vertical spring loaded pin contacts with a bottom surface of the electrostatic clamp terminal.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An apparatus for control of a temperature of a substrate comprising:
   a temperature-controlled base having a top surface, said base configured to receive cooling media to control a temperature of said base;
   a plate having a heater film thermally coupled to a bottom surface of the plate, the plate having a thickness adequate to transfer a spatial pattern of the heater film to the substrate, the plate having a bottom surface, the top and bottom surfaces being substantially parallel to each other and having a variation in surface flatness within about 0.0005 inch;
   a first layer of adhesive, wherein the first layer of adhesive is configured to bond said plate and said heater film to the top surface of said temperature-controlled base, said first layer of adhesive having a variation in thickness within 0.001 inch; and a layer of dielectric material bonded to a top surface of said plate, the layer of dielectric material configured to form an electrostatic clamping mechanism for supporting the substrate.

2. The apparatus of claim 1 wherein the top surface of said temperature-controlled base is substantially flat with a variation in flatness of less than 0.0003 inch, said layer of adhesive is a mechanically flexible adhesive having a thickness no greater than about 0.04 inch and the layer of dielectric material has a variation in surface flatness within 0.001 inch.

3. The apparatus of claim 1 wherein a surface dimension of said plate is substantially similar to a surface dimension of said temperature-controlled base.

4. The apparatus of claim 1 wherein said plate consists entirely of metal or entirely of ceramic and said first layer of adhesive has a thickness of 0.013 to 0.04 inch.

5. The apparatus of claim 1 wherein said heater film has a variation in surface flatness within 0.0005 inch.

6. The apparatus of claim 1 wherein said heater film includes resistive heating elements with a pattern layout providing spatial temperature control on the surface of the layer of dielectric material.

7. The apparatus of claim 6 wherein said plate is a metal plate and said resistive heating elements are configured to form a pattern layout on said metal plate.

8. The apparatus of claim 1 wherein said first layer of adhesive has a thermal transfer coefficient of 0.17 W/m-° K to 0.51 W/m-° K.

9. The apparatus of claim 1 wherein said plate is a ceramic plate of aluminum nitride or aluminum oxide.

10. The apparatus of claim 1 wherein said first layer of adhesive includes a top layer of bonding material, a plastic plate and a bottom layer of bonding material and the plastic plate includes a top and bottom surface, said top and bottom surface being substantially parallel to each other to within about 0.001 inch and the plastic plate has a thickness of 0.006 to 0.020 inch.

11. The apparatus of claim 10 wherein a thermal conductivity of said first layer of adhesive is based on relative power levels employed by said heater film and an external process.

12. The apparatus of claim 10 wherein said bottom surface of said plastic plate is bonded to said top surface of said base with the bottom layer of bonding material having a substantially high thermal conductivity and a thickness variation within 0.001 inch.

13. The apparatus of claim 12 wherein said top surface of said plastic plate is bonded to the heater film with the top layer of bonding material having a substantially high thermal conductivity and a thickness variation within 0.0005 inch.

14. The apparatus of claim 1 further comprising an electrical connector having:
   a vertical spring loaded pin having a top end in contact with a bottom surface of the layer of dielectric material, said vertical spring loaded pin disposed in a cavity of said base, and first layer of adhesive layer, and said heater film and said plate; and
   a bushing configured to enclose a portion of said top end of said pin, said bushing being thermally conductive and thermally coupled to said heater film and said dielectric layer and said bushing being electrically non-conductive.

15. The apparatus of claim 14 further comprising a socket configured to hold a bottom end of said pin.

16. The apparatus of claim 15 further comprising a plastic insulator cover configured to cover said socket and a portion of said pin to expose said top end of said pin.

17. The apparatus of claim 14 wherein said bushing is configured to electrically insulate said top end of said pin from a wall of said cavity in said base and to transfer an amount of heat from said heater film to said dielectric layer.

18. The apparatus of claim 1 wherein the heater film is in contact with the underside of the plate and the layer of dielectric material is bonded to the top surface of the plate with a second layer of adhesive.

19. The apparatus of claim 1 wherein the base is made of metal and the plate is an aluminum plate with a thickness of 0.040 inch and variation in surface flatness of top and bottom surfaces thereof within 0.0005 inch.

* * * * *